United States Patent

Howell et al.

[11] Patent Number: 5,995,366
[45] Date of Patent: Nov. 30, 1999

[54] COMPUTER ANTI-THEFT SYSTEM AND METHOD

[75] Inventors: Bryan Howell; Steve Gluskoter; Chris Jaggers, all of Austin; Orin M. Ozias, Cedar Park, all of Tex.

[73] Assignee: Dell U.S.A., L.P., Round Rock, Tex.

[21] Appl. No.: 09/007,958

[22] Filed: Jan. 16, 1998

[51] Int. Cl.[6] .............................. G06F 1/16; H05K 2/10; E05B 73/00
[52] U.S. Cl. .................. 361/686; 70/57; 70/14; 248/552; 248/553
[58] Field of Search .................. 361/686, 683; 248/552, 553; 312/223.1, 223.2; 70/14, 57, 58, 32–34

[56] References Cited

U.S. PATENT DOCUMENTS

| | | |
|---|---|---|
| 5,447,044 | 9/1995 | Cheng .......................................... 70/58 |
| 5,447,045 | 9/1995 | Cheng . |
| 5,450,271 | 9/1995 | Fukushima et al. ..................... 361/686 |
| 5,568,359 | 10/1996 | Cavello et al. . |
| 5,692,400 | 12/1997 | Bilven et al. ............................... 70/58 |

Primary Examiner—Leo P. Picard
Assistant Examiner—Lisa Lea-Edmonds
Attorney, Agent, or Firm—Haynes and Boone, L.L.P

[57] ABSTRACT

A computer anti-theft system for use with various lock devices includes a docking device and a computer engaged with the docking device by an interconnecting lock. A handle is provided for moving the latch to disengage the computer and the docking device. A first lock receiver is provided adjacent the handle for receiving a first type of lock for limiting movement of the handle to prevent disengagement of the docking device and the computer. A second lock receiver is also provided adjacent the handle for receiving a second type of lock, different from the first type, for limiting movement of the handle to prevent disengagement of the docking device and the computer.

20 Claims, 3 Drawing Sheets

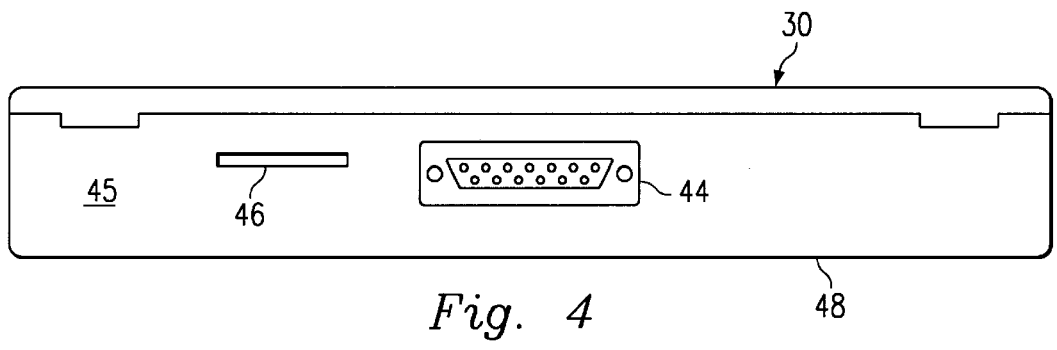
Fig. 4
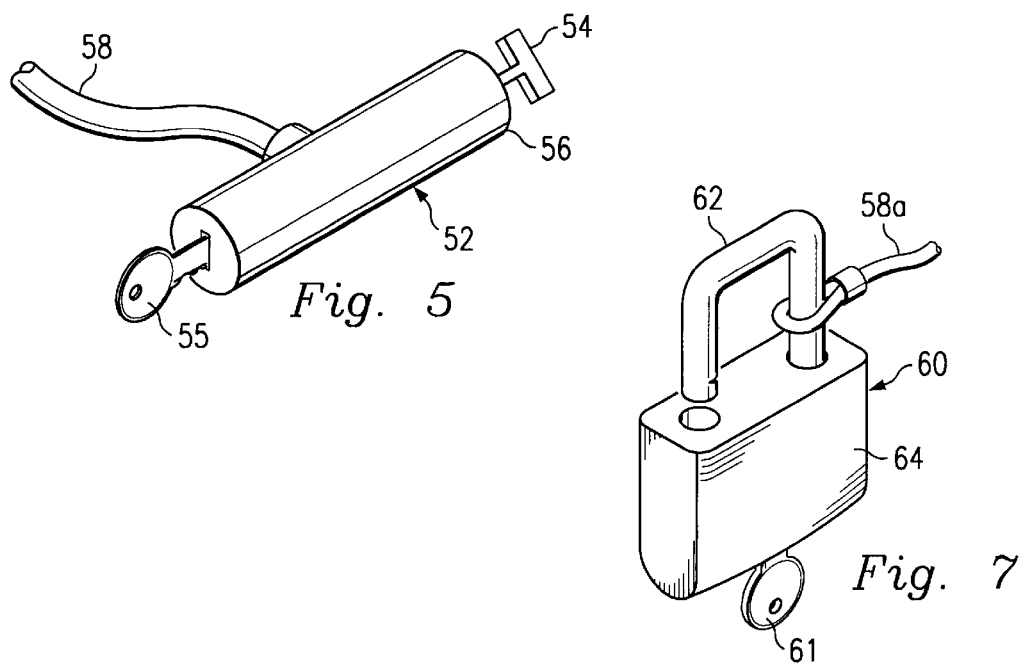
Fig. 5
Fig. 7
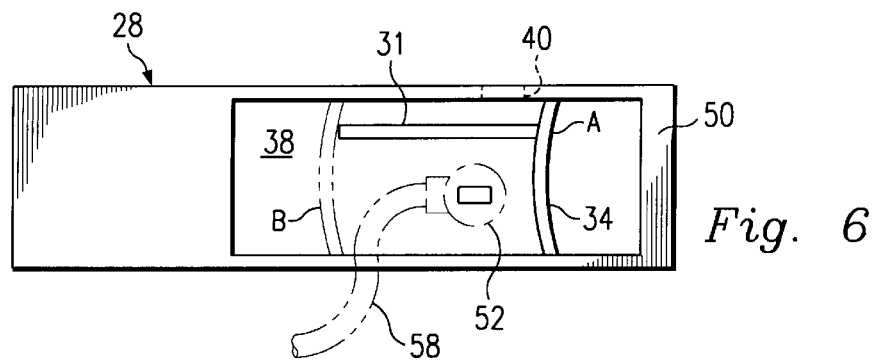
Fig. 6

COMPUTER ANTI-THEFT SYSTEM AND METHOD

BACKGROUND

The disclosures herein relate generally to computers and more particularly to a method and apparatus for providing multiple anti-theft systems for computers.

Port replicators are docking devices which attach to the back of a portable notebook computer via a single docking connector. Replicators have several other connectors which remain connected to various cables, e.g. printer, power, video, etc. In this manner, a notebook computer can pass standard I/O signals to peripheral devices via the port replicator without the need to make all of the cable connections directly to the notebook computer. Thus, the user of the notebook computer can quickly engage and disengage the notebook computer from the replicator. Docking stations are docking devices similar to port replicators but offer more features and functions and are therefore physically larger in size than port replicators.

There are various methods of interconnecting notebook computers with port replicators and docking stations. Some models merely plug in. Others include mechanical assist devices to urge the interconnected plugs apart to overcome the gripping effect of the male-female connection. Still others include interlatching devices for security purposes thus providing both an electrical-mechanical plug connection and a security latching device.

Because of the small size of notebook computers, the port replicators and the docking station, and the ease of engaging and disengaging the notebook computers, theft of each of these devices is not only possible, but quite common. To avoid such theft, several lock-type security measures have been devised. These devices typically include a padlock and a lock cable which tether the computer, or the computer and the associated docking device, to a table or to the user's desk.

In one application, an apparatus for locking a closed notebook computer on a computer support includes a lock support which has a counterbore and a shackle hole which are formed therethrough and which intersect each other. The computer has a computer housing and a display unit pivoted to the computer housing. An L-shaped locking plate has a horizontal portion located intermediately over the display unit, and a vertical portion with an aperture located between the lock support and the display unit. A bolt member extends through the counterbore of the lock support and the aperture of the L-shaped locking plate to engage threadably with the threaded hole of the computer. A padlock is fastened to the computer support and has a shackle extending through the shackle hold of the lock support so as to cover the recess portion of the bolt member, thereby preventing the bolt member from being accessed by a screwdriver.

Another known device utilizes a commercially available cylinder lock device which includes a rotatable locking member insertable into a corresponding slot in the computer. A locking cable attached to the cylinder lock is used to secure the computer, and an associated docking device to a desk, or the like. The cylinder lock device is more expensive than some users are willing to pay. The padlock devices are less costly but are sometimes too bulky for the system and it becomes difficult to provide secure ways to attach the padlocks to the notebook computers and/or the docking devices.

As an example of the cylinder lock application, a portable computer desktop docking system includes a base structure, a port replicator, a shroud and a monitor stand. The base structure is horizontally supportable on a desktop and has an upwardly and rearwardly sloping top side with the port replicator being mounted on a rear section thereof. To dock the computer, it is manually slid rearwardly along the top side of the base structure until a rear side connector on the computer is forcibly mated with a front side connector on the port replicator. The port replicator has a rear side connectable to desktop peripheral device electrical cables. The shroud structure snaps onto a rear side of the base structure, conceals port replicator end portions of the cables, and groups the cables so that they exit the shroud structure in a horizontally central rear side portion thereof. The monitor stand has a monitor support platform from which four support legs depend. Bottom ends of the legs interlock with side edge projections on the base structure to position the platform above the port replicator and parallel with the desktop. A front pair of these side edge projections are positioned to permit the user's index fingers to rearwardly hook around them so that the user's thumbs can engage spaced apart front side portions of the computer and provide leverage for manually pushing the computer rearwardly along the top side of the support base structure to forcibly interconnect the port replicator and computer connector structures during docking.

Therefore, what is needed is a security system that secures both a docking device and an attached notebook computer, and which can accommodate a cylinder lock and cable device or which can accommodate a less expensive padlock and cable device, if preferred by the user.

SUMMARY

One embodiment, accordingly, provides an apparatus and method of maintaining a docking device and a notebook computer secured together, and also provides for use of a cylinder lock and cable device or a padlock and cable device. To this end, a computer anti-theft device includes a docking device and a computer engaged with the docking device by an interconnecting latch. A handle is provided for moving the latch to disengage the computer and the docking device. A first lock receiver is adjacent the handle for receiving a first type of lock for limiting movement of the handle to prevent disengagement of the docking device and the computer. A second lock receiver is also adjacent the handle for receiving a second type of lock, different from the first type, for limiting movement of the handle to prevent disengagement of the docking device and the computer.

A principal advantage of this embodiment is that a docking device and a notebook computer can be secured together, and the user can choose between different types of locking devices, i.e. a cylinder lock and cable or a padlock and cable.

BRIEF DESCRIPTION OF THE DRAWINGS

FIG. 4 is an end view illustrating an embodiment of the portable computer.

FIG. 5 is an isometric view illustrating an embodiment of a cylindrical locking device.

FIG. 6 is a side view illustrating an embodiment of the docking device and the cylindrical locking device.

FIG. 7 is an isometric view illustrating an embodiment of a padlock device.

DETAILED DESCRIPTION OF THE PREFERRED EMBODIMENT

Figure 1:
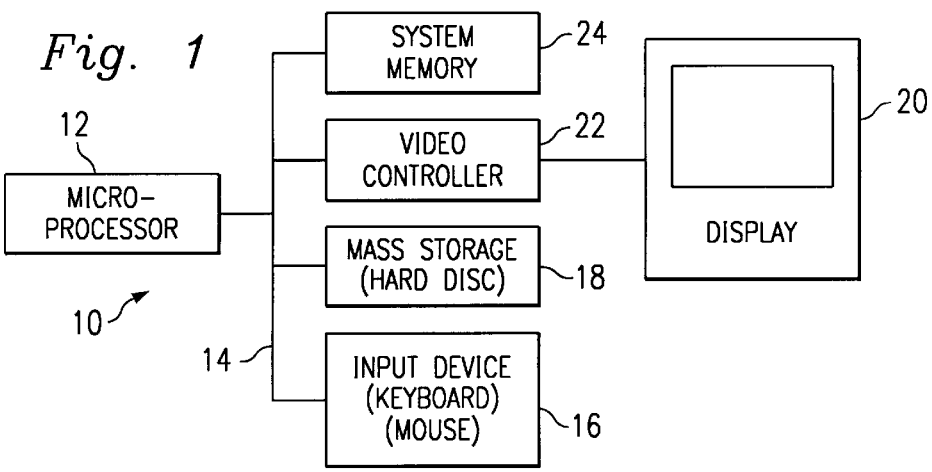
FIG. 1 is a diagrammatic view illustrating an embodiment of a typical computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to a microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
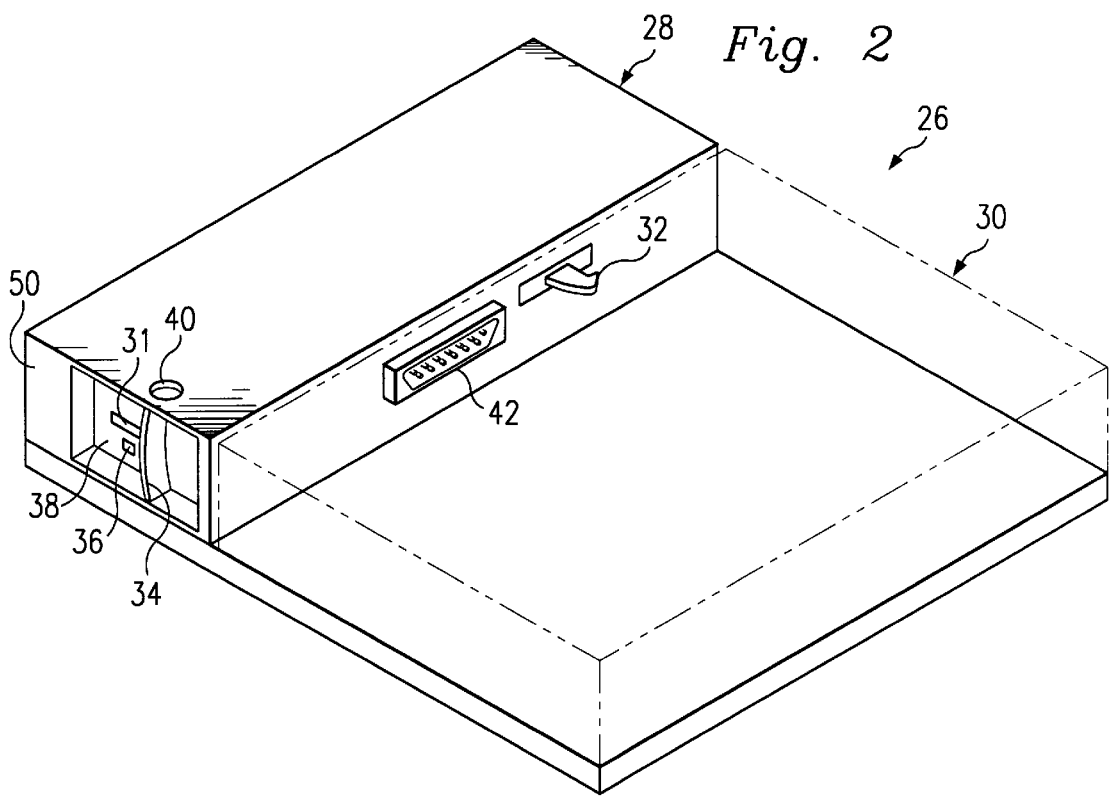
FIG. 2 is an isometric view illustrating an embodiment of a portable computer docked with a docking device.
Figure 3:
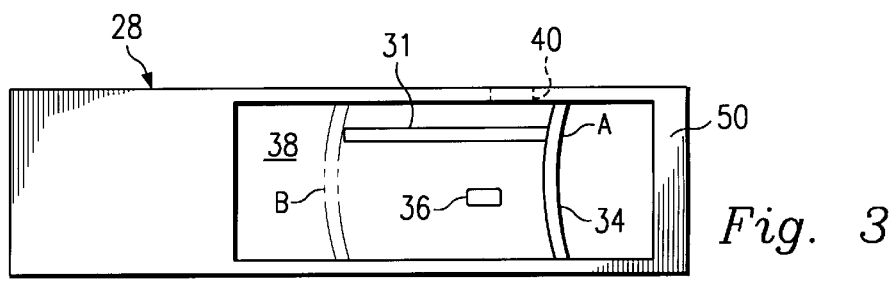
FIG. 3 is a side view illustrating an embodiment of the docking device.

A computer anti-theft device 26, FIG. 2, includes a docking device 28, which may be of the port replicator type or the docking station type, engaged with a portable notebook computer 30 by an interconnecting latch 32. A movable handle 34 is provided on the docking device 28 and linked for moving the latch 32 to disengage the computer 30 and the docking device 28. A first lock receiver 36, FIG. 3, is positioned in a recessed sidewall 38 adjacent the handle 34 for receiving a first type of lock for limiting movement of the handle 34 from a first position designated A to a second position designated B, to prevent disengagement of the docking device 28 and the computer 30. A second lock receiver 40, FIG. 2, is also positioned adjacent the handle 34 for receiving a second type of lock, which is different from the first type of lock, for limiting movement of the handle 34 to prevent disengagement of the docking device 28 and the computer 30. A slot 31 formed in sidewall 38 permits a suitable linkage (not shown) to connect handle 34 to latch 32.

A connector 42 of the docking device 28 engages a mating connector 44, FIG. 4, in an end wall 45 of the computer 30. A slot 46 formed in a housing portion 48 adjacent the mating connector 44 of the computer 30, is suitably provided to receive the latch 32, FIG. 2, for securing the attachment of the docking device 28 and the computer 30. The handle 34, FIG. 2, must be moved sufficiently in order to cause a corresponding movement of latch 32 which permits the connector 44, FIG. 4, of the computer 30 to be uncoupled from the connector 42, FIG. 2, of the docking device 28.

The first lock receiver 36, FIG. 3, includes a housing 50, which houses the docking device 28. Receiver 36 includes a rectangular opening formed in sidewall 38 adjacent the handle 34. The first type of lock 52, FIG. 5, is a commercially available cylindrical lock having a key rotatable rectangular portion 54 attached to one end 56 thereof and a security cable 58 connected to extend from lock 52. The rectangular portion 54 of the lock 52 inserts into the rectangular receiver opening 36, FIG. 3, and is rotated by a key 55 to prevent being withdrawn from the rectangular opening. The cylindrical body of the lock 52, FIG. 5, blocks and prevents movement of the handle 34 between positions A and B, see FIG. 6. The cable 58 may be connected to a secure stationary object.

Figure 8:
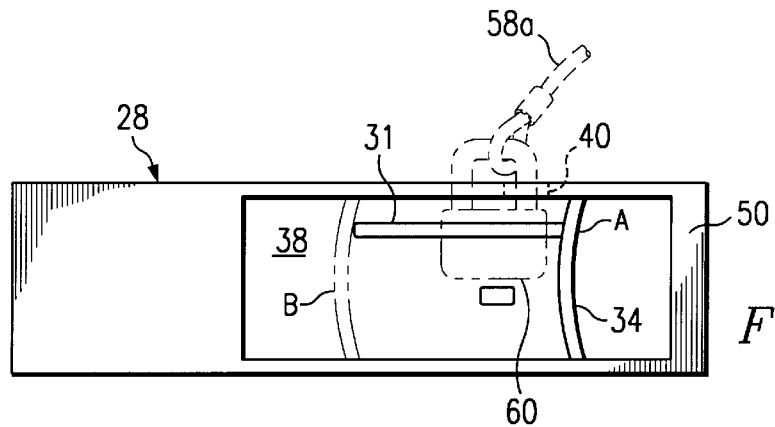
FIG. 8 is a side view illustrating an embodiment of the docking device and the padlock device.

The second lock receiver 40, FIG. 2, includes housing 50 which houses the docking device 28. Receiver 40, includes a circular opening formed therein adjacent to and above the handle 34. The second type of lock is a padlock 60, FIG. 7, of either a key 61 opening type or a combination opening type (not shown). A u-shaped loop portion 62 of the padlock 60 is inserted through the circular receiver opening 40, FIG. 8, and is snapped into locking engagement with a main body portion 64 of the padlock 60. The padlock 60 thus blocks and prevents movement of the handle 34 from position A to position B. A cable 58a is connected to the loop portion and extends therefrom to connect to a desk or a table (not shown) as mentioned above.

Figure 9:
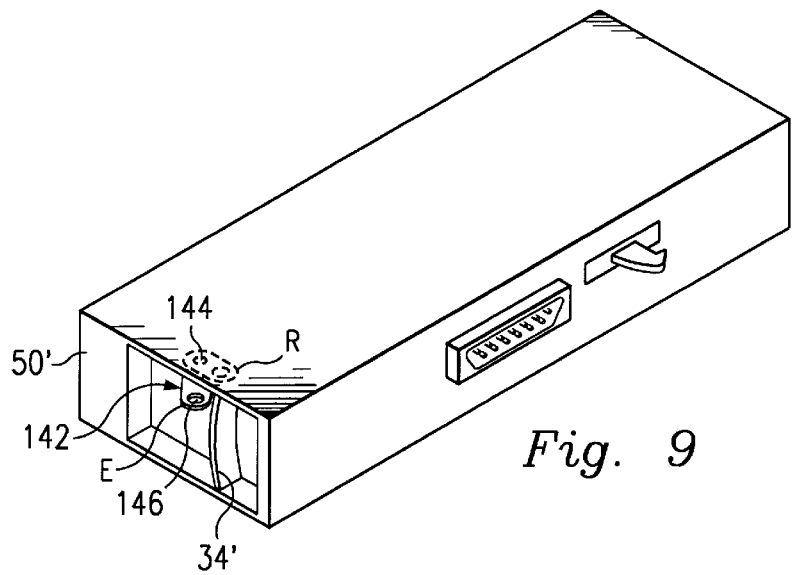
FIG. 9 is an isometric view illustrating an alternate embodiment of the docking device.
Figure 10:
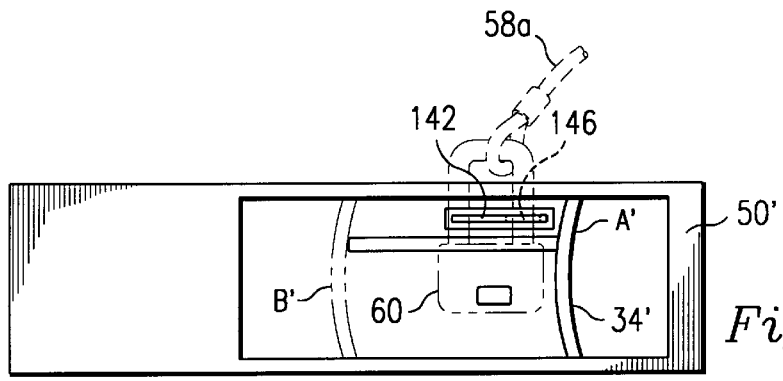
FIG. 10 is a side view illustrating the alternate embodiment of FIG. 9 and the padlock device.

As an alternative, an alternate lock receiver FIG. 9, may be provided in the form of a metal extension 142, mounted on housing 50 and pivotable about a pivot point 144 so as to be movable between an extendable position E and a retractable position R in housing 50 and positioned adjacent handle 34. Extension 142 includes and opening 146 formed therein for receiving padlock 50 FIG. 10, in the same manner as described above, thus blocking movement of handle 34 from position A to position B.

In operation, the typical computer system 10, including microprocessor 12, input 16, storage 18, display 20, video controller 22 and memory 24, is housed in the portable notebook computer 30 which docks with the docking device 26. The housing portion 48 of the computer 30 engages with the docking device 28 by the interconnecting latch 32. The handle 34 on the docking device 28 is movable from position A to position B and is connected for moving the latch 32 to disengage the computer 30 and the docking device 28.

The anti-theft system for computer and docking device includes engaging the portable notebook computer with the docking device by means of the interconnecting latch which is spring biased to automatically latch with the computer upon engagement. The latch is connected to the handle. The handle is movable and upon movement thereof, moves the latch to an unlatch position whereupon the computer is unlatched and removable from the docking device. However, in the event that either of the first lock or the second lock is engaged with its respective first or second lock receiver, the handle is limited from movement to disengage the latch, whereby the computer cannot be disengaged from the docking device.

As it can be seen, the principal advantage of these embodiments is that a docking device and a notebook computer can be secured together by a latch mechanism. The latch mechanism is actuatable by a simple handle which moves between a latch position and an unlatch position. The handle can be limited from movement to the unlatch position thus preventing disengagement of the computer from the docking device. Movement of the handle is limited by use of a cylinder lock or a padlock, each of which are tethered to a secure stationary object by a cable, thus preventing theft of the latched together docking device and computer and also preventing unlatching and theft of the computer from the docking device. The user can choose between the different type of locks. The cylindrical lock is substantially more expensive than the padlock, thus, the user is given the choice of using the less expensive padlock if desired.

Although illustrative embodiments have been shown and described, a wide range of modifications, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A computer anti-theft device comprising:
    a docking device;
    a computer engaged with the docking device by an interconnecting latch;
    a handle on the docking device for moving the latch to disengage the computer and the docking device;
    a first lock receiver adjacent the handle for receiving a first type of lock for limiting movement of the handle to prevent disengagement of the docking device and the computer; and
    a second lock receiver, adjacent the handle for receiving a second type of lock, different from the first type, for limiting movement of the handle to prevent disengagement of the docking device and the computer.

2. The device as defined in claim 1 wherein the first lock receiver includes a housing for the docking device having an opening formed therein adjacent the handle.

3. The device as defined in claim 1 wherein the second lock receiver includes a housing for the docking device having an opening formed therethrough adjacent the handle.

4. The device as defined in claim 1 wherein the first type of lock is a cylindrical lock having a portion inserted into the first lock receiver.

5. The device as defined in claim 1 wherein the second type of lock is a padlock having a portion inserted through the second lock receiver.

6. The device as defined in claim 1 wherein the first lock receiver includes a housing for the docking device having an opening formed therein adjacent the handle, the first type of lock being a cylindrical lock having a portion inserted into the opening.

7. The device as defined in claim 1 wherein the second lock receiver includes a housing for the docking device having an extendible member mounted therein adjacent the handle, the extendible member having an opening formed therethrough, the second type of lock being a padlock having a portion inserted through the opening.

8. The device as defined in claim 1 wherein the first lock receiver includes a housing for the docking device having an opening formed therein adjacent the handle, the first type of lock being a cylindrical lock having a portion inserted into the opening and a security cable attached thereto and extending therefrom.

9. The device as defined in claim 1 wherein the second lock receiver includes a housing for the docking device having an opening formed therethrough above the handle, the second type of lock being a padlock having a portion inserted through the opening and a security cable attached thereto and extending therefrom.

10. A computer system comprising:
    a microprocessor;
    an input coupled to provide input to the microprocessor;
    a mass storage coupled to the microprocessor;
    a display coupled to the microprocessor by a video controller;
    a memory coupled to provide storage to facilitate execution of computer programs by the microprocessor;
    a docking device;
    a computer housing engaged with the docking device by an interconnecting latch;
    a handle on the docking device for moving the latch to disengage the computer housing and the docking device;
    a first lock receiver adjacent the handle for receiving a first type of lock for limiting movement of the handle to prevent disengagement of the docking device and the computer; and
    a second lock receiver adjacent the handle for receiving a second type of lock, different from the first type, for limiting movement of the handle to prevent disengagement of the docking device and the computer.

11. The device as defined in claim 10 wherein the first lock receiver includes a housing for the docking device having an opening formed therein adjacent the handle.

12. The device as defined in claim 10 wherein the second lock receiver includes a housing for the docking device having an opening formed therethrough above the handle.

13. The device as defined in claim 10 wherein the first type of lock is a cylindrical lock having a portion inserted into the first lock receiver.

14. The device as defined in claim 10 wherein the second type of lock is a padlock having a portion inserted through the second lock receiver.

15. The device as defined in claim 10 wherein the first lock receiver includes a housing for the docking device having an opening formed therein adjacent the handle, the first type of lock being a cylindrical lock having a portion inserted into the opening.

16. The device as defined in claim 10 wherein the second lock receiver includes a housing for the docking device having an opening formed therethrough above the handle, the second type of lock being a padlock having a portion inserted through the opening.

17. The device as defined in claim 10 wherein the first lock receiver includes a housing for the docking device having an opening formed therein adjacent the handle, the first type of lock being a cylindrical lock having a portion inserted into the opening and a security cable attached thereto and extending therefrom.

18. The device as defined in claim 10 wherein the second lock receiver includes a housing for the docking device having an opening formed therethrough above the handle, the second type of lock being a padlock having a portion inserted through the opening and a security cable attached thereto and extending therefrom.

19. A method of providing a multiple anti-theft system for computers, comprising the steps of:
    engaging a computer with a docking device by an interconnecting latch;
    connecting the latch to a handle movable to unlatch the computer and the docking device;
    providing a first lock receiver adjacent the handle for receiving a first type of lock for limiting movement of the handle to prevent disengagement of the docking device and the computer; and
    providing a second lock receiver adjacent the handle for receiving a second type of lock, different from the first type, for limiting movement of the handle to prevent disengagement of the docking device and the computer.

20. The method as defined in claim 19 wherein the step of providing a first lock receiver includes the step of forming a first opening extending into the docking device adjacent the handle, and the step of providing a second lock receiver includes the step of forming a second opening through the docking device above the handle.

* * * * *

UNITED STATES PATENT AND TRADEMARK OFFICE
CERTIFICATE OF CORRECTION

PATENT NO. : 5,995,366
DATED : November 30, 1999
INVENTOR(S) : Ozias et al.

It is certified that error appears in the above-identified patent and that said Letters Patent is hereby corrected as shown below:

Column 4,
Line 26, delete "50", and insert -- 50' --.
Line 28, delete "50", and insert -- 50' --.
Line 29, delete "34", and insert -- 34' --; and change "and" to -- an --.
Line 30, change "padlock 50" to -- padlock 60 --.
Line 31, delete "34", and insert -- 34' --.
Line 32, delete "A", and insert -- A' --; and delete "B", and insert -- B' --.

Signed and Sealed this

Seventh Day of May, 2002

Attest:

Attesting Officer

JAMES E. ROGAN
Director of the United States Patent and Trademark Office